United States Patent
E

(10) Patent No.: US 11,300,825 B2
(45) Date of Patent: Apr. 12, 2022

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Shuang E, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 368 days.

(21) Appl. No.: 16/471,947

(22) PCT Filed: Apr. 16, 2019

(86) PCT No.: PCT/CN2019/082869
§ 371 (c)(1),
(2) Date: Jun. 20, 2019

(87) PCT Pub. No.: WO2020/124893
PCT Pub. Date: Jun. 25, 2020

(65) Prior Publication Data
US 2021/0341786 A1    Nov. 4, 2021

(30) Foreign Application Priority Data

Dec. 19, 2018 (CN) .......................... 201811559888.7

(51) Int. Cl.
*G02F 1/1335* (2006.01)
*G02F 1/1333* (2006.01)
(Continued)

(52) U.S. Cl.
CPC ..... *G02F 1/133528* (2013.01); *G02B 5/3033* (2013.01); *G02F 1/13338* (2013.01);
(Continued)

(58) Field of Classification Search
CPC combination set(s) only.
See application file for complete search history.

(56) References Cited

U.S. PATENT DOCUMENTS

2017/0277313 A1   9/2017   Lee et al.
2019/0094610 A1*  3/2019   Yukawa ............ G02F 1/133308
(Continued)

FOREIGN PATENT DOCUMENTS

CN    103631051 A    3/2014
CN    107611160 A    1/2018
(Continued)

*Primary Examiner* — Phu Vu

(57) ABSTRACT

The present application provides a display device whose polarizer is divided into a first-stage polarizer and a second-stage polarizer in a second region of a non-display area, and a gap is formed between the first-stage polarizer and the second-stage polarizer. Based on the gap formed between the first-stage polarizer and the second-stage polarizer, after the polarizer is attached to cover a touch panel, air bubbles existing between the polarizer and the touch panel will flow out through the gap. The display device avoids the entry of the air bubbles into a display area.

17 Claims, 3 Drawing Sheets

(51) Int. Cl.
 *G02B 5/30* (2006.01)
 *G02F 1/1345* (2006.01)
 *G06F 3/041* (2006.01)
 *H05K 1/02* (2006.01)

(52) U.S. Cl.
 CPC .... *G02F 1/13452* (2013.01); *G02F 1/133388* (2021.01); *G06F 3/041* (2013.01); *H05K 1/028* (2013.01)

(56) References Cited

U.S. PATENT DOCUMENTS

2019/0332200 A1\* 10/2019 Lee .................... G06F 3/04164
2020/0018880 A1    1/2020 Li et al.
2020/0092997 A1\*  3/2020 Song .................... H01L 51/56

FOREIGN PATENT DOCUMENTS

CN         1078707468 A     3/2018
CN          108627902 A    10/2018

\* cited by examiner

DISPLAY DEVICE

CROSS REFERENCE TO RELATED APPLICATION

This application claims the priority of International Application No. PCT/CN20191082869, filed on 2019 Apr. 16, which claims priority to Chinese Application No 2018115598887, filed on 2018 Dec. 19. The entire disclosures of each of the above applications are incorporated herein by reference.

BACKGROUND OF INVENTION

Field of Invention

The present invention relates to the field of display technologies, and in particular, to a display device.

Description of Prior Art

In existing display devices, such as liquid crystal displays (LCDs), organic light emitting diode (OLED) displays and the like, a polarizer (POL) is needed to control the liquid crystals to adjust light intensity.

As shown in FIG. 1, when a display device is assembled, a flexible circuit board FPC11 is bound to a touch panel 12 in a non-display area NA, and then a polarizer POL13 is attached to cover the touch panel 12 and the flexible circuit board FPC11. Because there is a gap between the flexible circuit board FPC11 and the touch panel 12 when bounding, air bubbles will be generated between the polarizer POL13 and the touch panel 12. Later, the bubbles will enter a display area AA, affecting the display effect.

That is, the existing display device has a technical problem that bubbles between the polarizer and the touch panel will enter the display area, which needs to be solved.

SUMMARY OF INVENTION

The present application provides a display device, to solve the technical problem that bubbles between the polarizer and the touch panel will enter the display area.

To solve the above problems, the technical solution provided by the present application is as follows.

An embodiment of the present application provides a display device, including:
  a touch panel;
  a flexible circuit board bounded to the touch panel in a first region of a non-display area;
  a polarizer covering the touch panel and a partial region of the flexible circuit board, wherein in a second region of the non-display area, the polarizer is divided into a first-stage polarizer and a second-stage polarizer by a dividing surface, and a gap is formed between the first-stage polarizer and the second-stage polarizer, and the second region is located between the first region and a display area.

In the display device of the present application, the first-stage polarizer and the second-stage polarizer are not connected.

In the display device of the present application, the dividing surface is a planar surface penetrating the polarizer.

In the display device of the present application, the dividing surface is a curved surface penetrating through the polarizer.

In the display device of the present application, the dividing surface is a sawtooth surface penetrating through the polarizer.

In the display device of the present application, the dividing surface is a composite surface penetrating through the polarizer, and the composite surface is composed of a planar surface and a curved surface.

In the display device of the present application, the dividing surface is a step surface formed by combining a first sub-dividing surface and a second sub-dividing surface, the first sub-dividing surface is for dividing a first triacetyl cellulos (TAC) film of the polarizer, and the second sub-dividing surface is for dividing a second TAC film of the polarizer.

In the display device of the present application, the first sub-dividing surface is a planar surface penetrating through the first TAC film.

In the display device of the present application, the first sub-dividing surface is a curved surface penetrating through the first TAC film.

In the display device of the present application, the second sub-dividing surface is a planar surface penetrating through the second TAC film.

In the display device of the present application, the first-stage polarizer and the second-stage polarizer are partially connected.

In the display device of the present application, the dividing surface is a planar surface larger than the flexible circuit board.

In the display device of the present application, the dividing surface is a curved surface larger than the flexible circuit board.

In the display device of the present application, the dividing surface is a sawtooth surface larger than the flexible circuit board.

In the display device of the present application, the dividing surface is a composite surface larger than the flexible circuit board, and the composite surface is composed of a planar surface and a curved surface.

In the display device of the present application, the dividing surface is a step surface formed by combining a third sub-dividing surface and a fourth sub-dividing surface, wherein the third sub-dividing surface is used for dividing a first triacetyl cellulos (TAC) film of the polarizer, and the fourth sub-dividing surface is used for dividing a second TAC film of the polarizer.

In the display device of the present application, the third sub-dividing surface is a planar surface larger than the flexible circuit board.

In the display device of the present application, the third sub-dividing surface is a curved surface larger than the flexible circuit board.

In the display device of the present application, the third sub-dividing surface is a sawtooth surface larger than the flexible circuit board.

In the display device of the present application, the third sub-dividing surface is a composite surface larger than the flexible circuit board, and the composite surface is composed of a planar surface and a curved surface.

The present application provides a display device including a touch panel, a flexible circuit board bounded to the touch panel in a first region of a non-display area, a polarizer covering the touch panel and a partial region of the flexible circuit board, wherein in a second region of the non-display area, the polarizer is divided into a first-stage polarizer and a second-stage polarizer by a dividing surface, and a gap is formed between the first-stage polarizer and the second-stage polarizer, and the second region is located between the first region and a display area. Based on the gap formed between the first-stage polarizer and the second-stage polarizer, after the polarizer is attached to cover the touch panel, air bubbles existing between the polarizer and the touch panel will flow out through the gap. The application avoids the entry of the air bubbles into the display area and solves the technical problem that the air bubbles between the polarizer and the touch panel will enter the display area in the existing display device.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
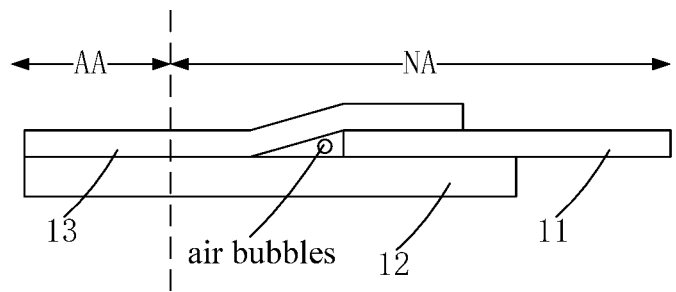
FIG. 1 is a schematic diagram showing bonding of a polarizer in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present application provides a display device to solve the technical problem that bubbles between a polarizer and a touch panel will enter a display area.

As shown in FIG. 2 to FIG. 9, a display device 2 provided by the embodiment of the present application includes:

a touch panel 21;

a flexible circuit board 22 bounded to the touch panel 21 in a first region S1 of a non-display area NA;

a polarizer 23 covering the touch panel 21 and a partial region of the flexible circuit board 22, wherein in a second region S2 of the non-display area NA, the polarizer 23 is divided into a first-stage polarizer 231 and a second-stage polarizer 232 by a dividing surface, and a gap is formed between the first-stage polarizer 231 and the second-stage polarizer 232, and the second region S2 is located between the first region S1 and a display area AA.

The present application provides a display device including a touch panel, a flexible circuit board bounded to the touch panel in a first region of a non-display area, a polarizer covering the touch panel and a partial region of the flexible circuit board, wherein in a second region of the non-display area, the polarizer is divided into a first-stage polarizer and a second-stage polarizer by a dividing surface, and a gap is formed between the first-stage polarizer and the second-stage polarizer, and the second region is located between the first region and a display area. Based on the gap formed between the first-stage polarizer and the second-stage polarizer, after the polarizer is attached to cover the touch panel, air bubbles existing between the polarizer and the touch panel will flow out through the gap. The application avoids the entry of the air bubbles into the display area and solves the technical problem that the air bubbles between the polarizer and the touch panel will enter the display area in the existing display device.

In an embodiment, as showing in FIG. 2 to FIG. 5, the first-stage polarizer 231 and the second-stage polarizer 232 are not connected.

Figure 2:
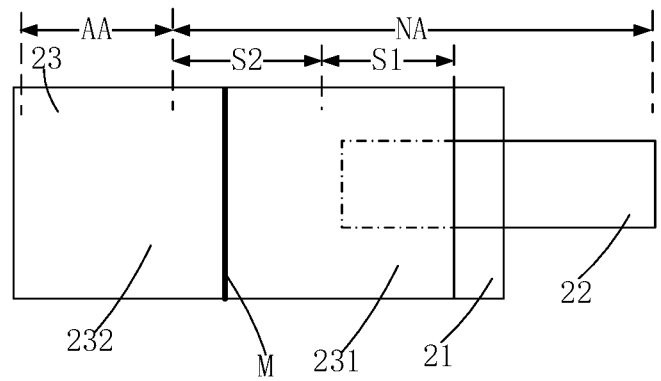
FIG. 2 is a first perspective schematic diagram of a display device according to an embodiment of the present application.
Figure 3:
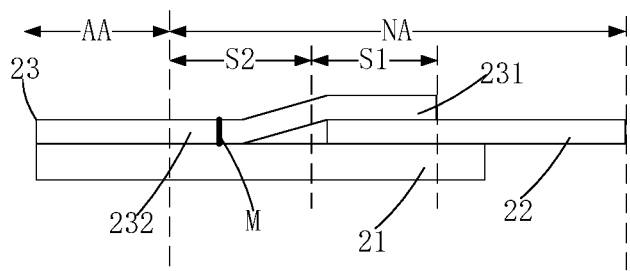
FIG. 3 is a first schematic cross-sectional diagram of a display device according to an embodiment of the present application.

In an embodiment, as showing in FIG. 2 or FIG. 3, the dividing surface is a planar surface penetrating the polarizer.

In an embodiment, the dividing surface is a curved surface penetrating through the polarizer. The curved surface is shown in FIG. 4.

Figure 6:
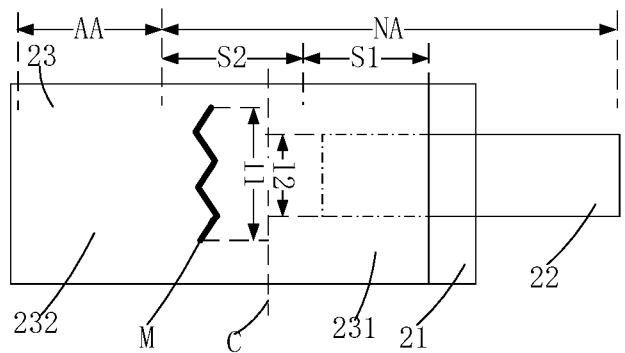
FIG. 6 is a third perspective schematic diagram of a display device according to an embodiment of the present application.

In an embodiment, the dividing surface is a sawtooth surface penetrating through the polarizer. The sawtooth surface is shown in FIG. 6.

Figure 8:
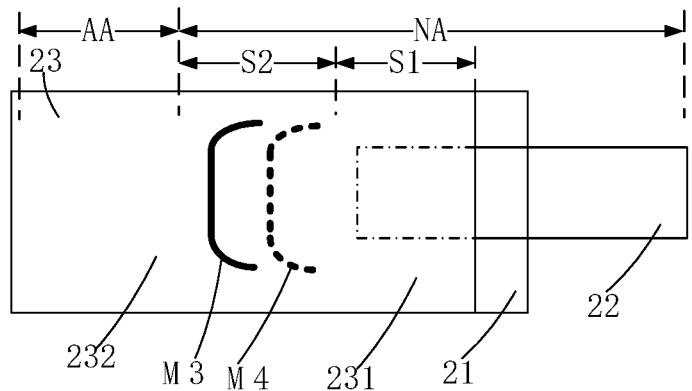
FIG. 8 is a perspective schematic diagram of a fourth display device according to an embodiment of the present application.

In an embodiment, the dividing surface is a composite surface penetrating through the polarizer, and the composite surface is composed of a planar surface and a curved surface. The composite surface is shown in FIG. 8.

Figure 4:
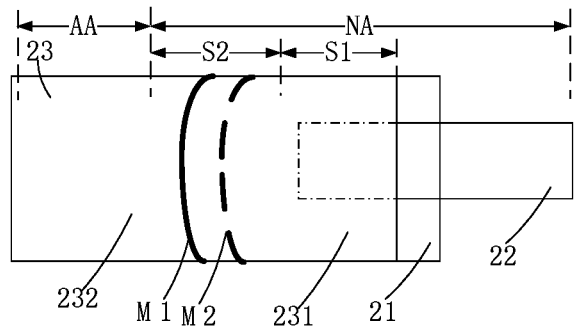
FIG. 4 is a second perspective schematic diagram of a display device according to an embodiment of the present application.
Figure 5:
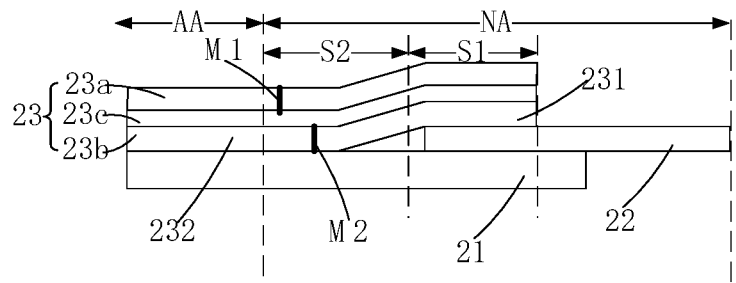
FIG. 5 is a second schematic cross-sectional diagram of a display device according to an embodiment of the present application.

In an embodiment, as shown in FIG. 4 or FIG. 5, the polarizer includes a first triacetyl cellulos (TAC) film 23a, a second TAC film 23b, and a polyvinyl alcohol (PVA) film 23c between the first TAC film 23a and the second TAC film 23b.

In an embodiment, as shown in FIG. 4 or FIG. 5, a dividing surface M is a step surface formed by combining a first sub-dividing surface M1 and a second sub-dividing surface M2. The first sub-dividing surface M1 is for dividing the first TAC film 23a of the polarizer, and the second sub-dividing surface is for dividing the second TAC film 23b of the polarizer.

In an embodiment, the first sub-dividing surface M1 is a planar surface penetrating through the first TAC film 23a.

In an embodiment, the first sub-dividing surface M1 is a curved surface penetrating through the first TAC film 23a.

In an embodiment, the first sub-dividing surface M1 is a sawtooth surface penetrating through the first TAC film 23a.

In an embodiment, the first sub-dividing surface M1 is a composite surface penetrating through the first TAC film 23a, and the composite surface is composed of a planar surface and a curved surface.

In an embodiment, the second sub-dividing surface M2 is a planar surface penetrating through the second TAC film 23b.

In an embodiment, the second sub-dividing surface M2 is a curved surface penetrating through the second TAC film 23b.

In an embodiment, the second sub-dividing surface M2 is a sawtooth surface penetrating through the second TAC film 23b.

In an embodiment, the second sub-dividing surface M2 is a composite surface penetrating through the second TAC film 23b, and the composite surface is composed of a planar surface and a curved surface.

In an embodiment, as shown in FIG. 6 to FIG. 9, the first-stage polarizer 231 and the second-stage polarizer 232 are partially connected.

Figure 7:
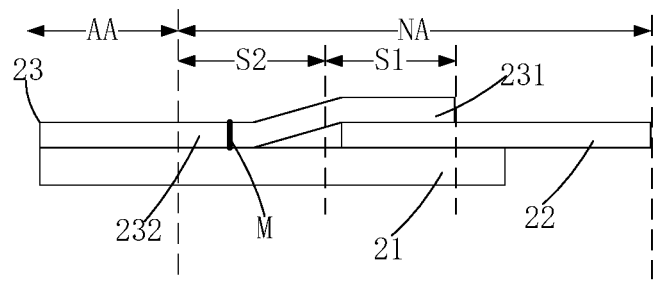
FIG. 7 is a third schematic cross-sectional diagram of a display device according to an embodiment of the present application.

In an embodiment, as shown in FIG. 6 to FIG. 7, the dividing surface M is a planar surface larger than the flexible circuit board 22.

In an embodiment, as shown in FIG. 6, the dividing plane M being larger than the planar surface of the flexible circuit means that the projection length 11 of the dividing plane M is greater than the projection length 12 of the flexible circuit board 22 on a reference plane C (a planar surface perpendicular to a surface and a side of the touch panel, the side of the touch panel refers to the side adjacent to the bounding region).

In an embodiment, the dividing surface is a curved surface larger than the flexible circuit board.

In an embodiment, the dividing surface is a sawtooth surface larger than the flexible circuit board.

In an embodiment, the dividing surface is a composite surface larger than the flexible circuit board, and the composite surface is composed of a planar surface and a curved surface.

Figure 9:
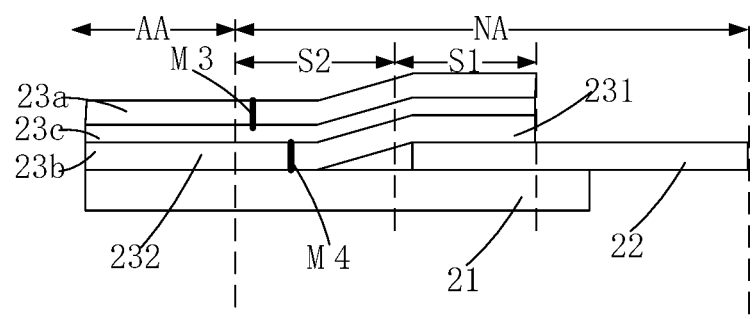
FIG. 9 is a fourth schematic cross-sectional diagram of a display device according to an embodiment of the present application.

In an embodiment, as shown in FIG. 8 to FIG. 9, the dividing surface M is a step surface formed by combining a third sub-dividing surface M3 and a fourth sub-dividing surface M4, wherein the third sub-dividing surface M3 is used for dividing a first TAC film 23a of the polarizer, and the fourth sub-dividing surface M4 is used for dividing a second TAC film 23b of the polarizer.

In an embodiment, the third sub-dividing surface is a planar surface larger than the flexible circuit board.

In an embodiment, the third sub-dividing surface is a curved surface larger than the flexible circuit board.

In an embodiment, the third sub-dividing surface is a sawtooth surface larger than the flexible circuit board.

In an embodiment, the third sub-dividing surface is a composite surface larger than the flexible circuit board, and the composite surface is composed of a planar surface and a curved surface.

In an embodiment, the fourth sub-dividing surface is a planar surface larger than the flexible circuit board.

In an embodiment, the fourth sub-dividing surface is a curved surface larger than the flexible circuit board.

In an embodiment, the fourth sub-dividing surface is a sawtooth surface larger than the flexible circuit board.

In an embodiment, the fourth sub-dividing surface is a composite surface larger than the flexible circuit board, and the composite surface is composed of a planar surface and a curved surface.

According to the above embodiment, it can be known that:

the present application provides a display device including a touch panel, a flexible circuit board bounded to the touch panel in a first region of a non-display area, a polarizer covering the touch panel and a partial region of the flexible circuit board, wherein in a second region of the non-display area, the polarizer is divided into a first-stage polarizer and a second-stage polarizer by a dividing surface, and a gap is formed between the first-stage polarizer and the second-stage polarizer, and the second region is located between the first region and a display area. Based on the gap formed between the first-stage polarizer and the second-stage polarizer, after the polarizer is attached to cover the touch panel, air bubbles existing between the polarizer and the touch panel will flow out through the gap. The application avoids the entry of the air bubbles into the display area and solves the technical problem that the air bubbles between the polarizer and the touch panel will enter the display area in the existing display device.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display device, comprising:
   a touch panel;
   a flexible circuit board bounded to the touch panel in a first region of a non-display area;
   a polarizer covering the touch panel and a partial region of the flexible circuit board, wherein in a second region of the non-display area, the polarizer is divided into a first-stage polarizer and a second-stage polarizer by a dividing surface, and a gap is formed between the first-stage polarizer and the second-stage polarizer, and the second region is located between the first region and a display area;
   wherein the first-stage polarizer and the second-stage polarizer are not connected; and
   the dividing surface is a step surface formed by combining a first sub-dividing surface and a second sub-dividing surface, the first sub-dividing surface is for dividing a first triacetyl cellulos (TAC) film of the polarizer, and the second sub-dividing surface is for dividing a second TAC film of the polarizer.

2. The display device according to claim 1, wherein the dividing surface is a planar surface penetrating the polarizer.

3. The display device according to claim 1, wherein the dividing surface is a curved surface penetrating through the polarizer.

4. The display device according to claim 1, wherein the dividing surface is a sawtooth surface penetrating through the polarizer.

5. The display device according to claim 1, wherein the dividing surface is a composite surface penetrating through the polarizer, and the composite surface is composed of a planar surface and a curved surface.

6. The display device according to claim 1, wherein the first sub-dividing surface is a planar surface penetrating through the first TAC film.

7. The display device according to claim 1, wherein the first sub-dividing surface is a curved surface penetrating through the first TAC film.

8. The display device according to claim 1, wherein the second sub-dividing surface is a planar surface penetrating through the second TAC film.

9. A display device, comprising:
   a touch panel;

a flexible circuit board bounded to the touch panel in a first region of a non-display area;

a polarizer covering the touch panel and a partial region of the flexible circuit board, wherein in a second region of the non-display area, the polarizer is divided into a first-stage polarizer and a second-stage polarizer by a dividing surface, and a gap is formed between the first-stage polarizer and the second-stage polarizer, and the second region is located between the first region and a display area;

wherein the first-stage polarizer and the second-stage polarizer are partially connected; and wherein the dividing surface is a step surface formed by combining a third sub-dividing surface and a fourth sub-dividing surface, wherein the third sub-dividing surface is used for dividing a first triacetyl cellulos (TAC) film of the polarizer, and the fourth sub-dividing surface is used for dividing a second TAC film of the polarizer.

10. The display device according to claim 9, wherein the dividing surface is a planar surface larger than the flexible circuit board.

11. The display device according to claim 9, wherein the dividing surface is a curved surface larger than the flexible circuit board.

12. The display device according to claim 9, wherein the dividing surface is a sawtooth surface larger than the flexible circuit board.

13. The display device according to claim 9, wherein the dividing surface is a composite surface larger than the flexible circuit board, and the composite surface is composed of a planar surface and a curved surface.

14. The display device according to claim 9, wherein the third sub-dividing surface is a planar surface larger than the flexible circuit board.

15. The display device according to claim 9, wherein the third sub-dividing surface is a curved surface larger than the flexible circuit board.

16. The display device according to claim 9, wherein the third sub-dividing surface is a sawtooth surface larger than the flexible circuit board.

17. The display device according to claim 9, wherein the third sub-dividing surface is a composite surface larger than the flexible circuit board, and the composite surface is composed of a planar surface and a curved surface.

* * * * *